(12) United States Patent
Hsu

(10) Patent No.: US 8,982,569 B2
(45) Date of Patent: Mar. 17, 2015

(54) POWER CONVERSION CIRCUIT AND CIRCUIT BOARD

(75) Inventor: Ming-Yuan Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 738 days.

(21) Appl. No.: 13/271,167

(22) Filed: Oct. 11, 2011

(65) Prior Publication Data

US 2013/0058053 A1    Mar. 7, 2013

(30) Foreign Application Priority Data

Sep. 2, 2011   (TW) .............................. 100131797 A

(51) Int. Cl.
*H05K 7/00*     (2006.01)
*G01R 31/40*    (2014.01)
*H04M 1/24*     (2006.01)
*H02M 1/00*     (2006.01)

(52) U.S. Cl.
CPC ................. *G01R 31/40* (2013.01); *H04M 1/24* (2013.01); *H02M 2001/007* (2013.01)
USPC ......................................... 361/748

(58) Field of Classification Search
USPC ......................................... 361/748
See application file for complete search history.

(56) References Cited

U.S. PATENT DOCUMENTS

| | | | | |
|---|---|---|---|---|
| 4,672,301 A | * | 6/1987 | Westfall et al. | 323/243 |
| 5,384,433 A | * | 1/1995 | Osann et al. | 174/250 |
| 5,869,961 A | * | 2/1999 | Spinner | 324/756.02 |

* cited by examiner

*Primary Examiner* — Ramon Barrera
(74) *Attorney, Agent, or Firm* — Novak Druce Connolly Bove + Quigg LLP

(57) ABSTRACT

An exemplary power conversion circuit is to convert a voltage from one voltage level to another. The circuit includes an input port, an output port, a main body circuit, a first solder bridge, and a second solder bridge. The input port of the power conversion circuit is an output port of one power conversion circuit previous in sequence to the power conversion circuit, the output port of the power conversion circuit is an input port of one power conversion circuit next in sequence to the power conversion circuit. The first solder bridge is arranged between the input port of the power conversion circuit and the main body circuit of the power conversion circuit. The second solder bridge is arranged between the output port of the power conversion circuit and the main body circuit of the power conversion circuit.

13 Claims, 2 Drawing Sheets

POWER CONVERSION CIRCUIT AND CIRCUIT BOARD

BACKGROUND

1. Technical Field

The present disclosure relates to power conversion circuits and circuit boards and, particularly, to a power conversion circuit and a circuit board capable of conveniently testing the voltage and current of the power conversion circuit.

2. Description of Related Art

Power conversion circuits are important in portable electronic devices such as cellular phones and laptop computers to convert a voltage from one voltage level to another, thus different ICs of the electronic devices, which require different voltages can be satisfied. If the power conversion circuits are in an abnormal state, the current and voltage output by the power conversion circuit may not satisfy the requirement of ICs, thus the ICs may be damaged or in an abnormal state. Therefore, the test of the voltage and the current of the power conversion circuits are important.

Typically, power conversion circuits of a circuit board are connected to each other. The conventional method of testing the voltage and the current of one power conversion circuit is to cut the copper foil of the circuit board between an input port of the power conversion circuit and an output port of the power conversion circuit, thus the connection between a power supply and each IC of the circuit board is cut off. A DC power supply can be then employed to provide a predetermined voltage to the input port of the power conversion circuit, and a multimeter can be then employed to test the voltage and the current of the power conversion circuit. This conventional testing method may be troublesome for operators due to difficulty of cutting copper foil.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The embodiments of the present disclosure are now described in detail, with reference to the accompanying drawings.

Figure 1:
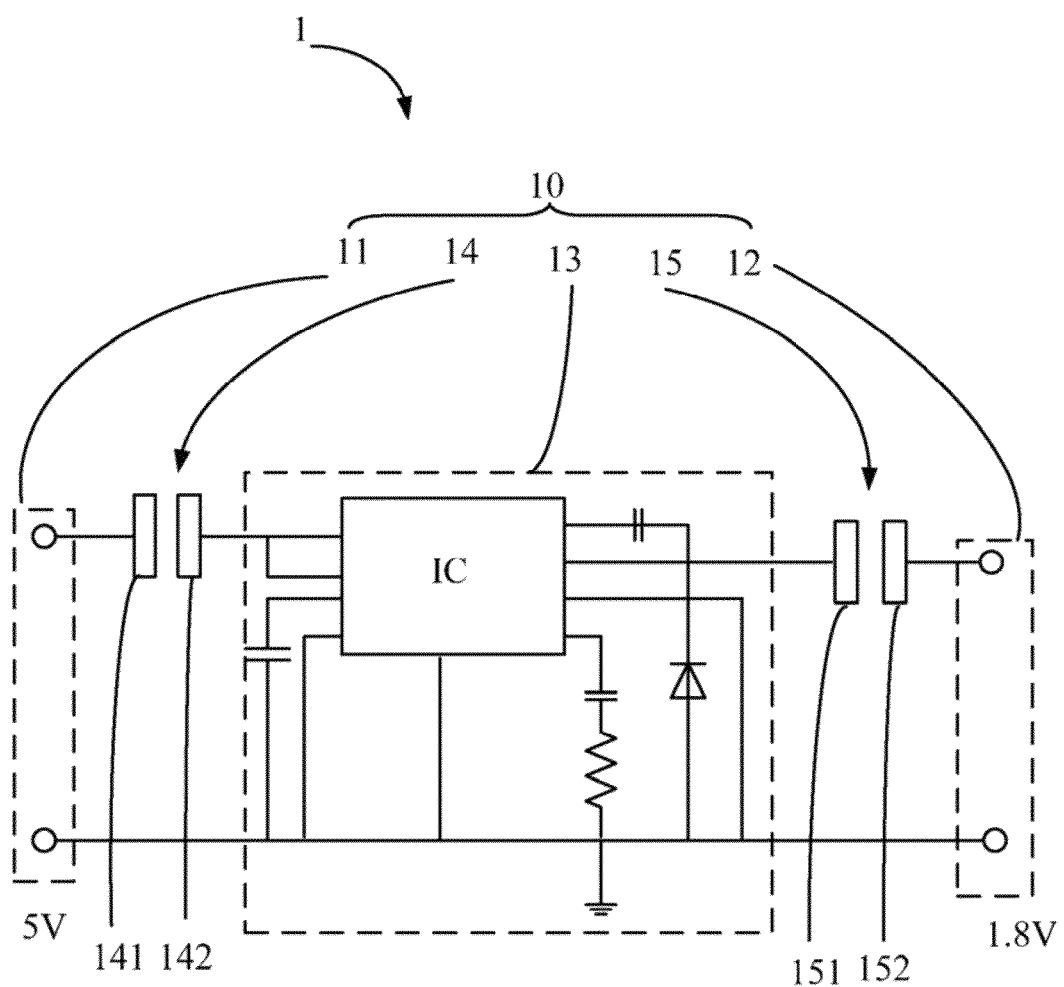
FIG. 1 is a circuit diagram of a power conversion circuit of a circuit board in accordance with an exemplary embodiment.
Figure 2:
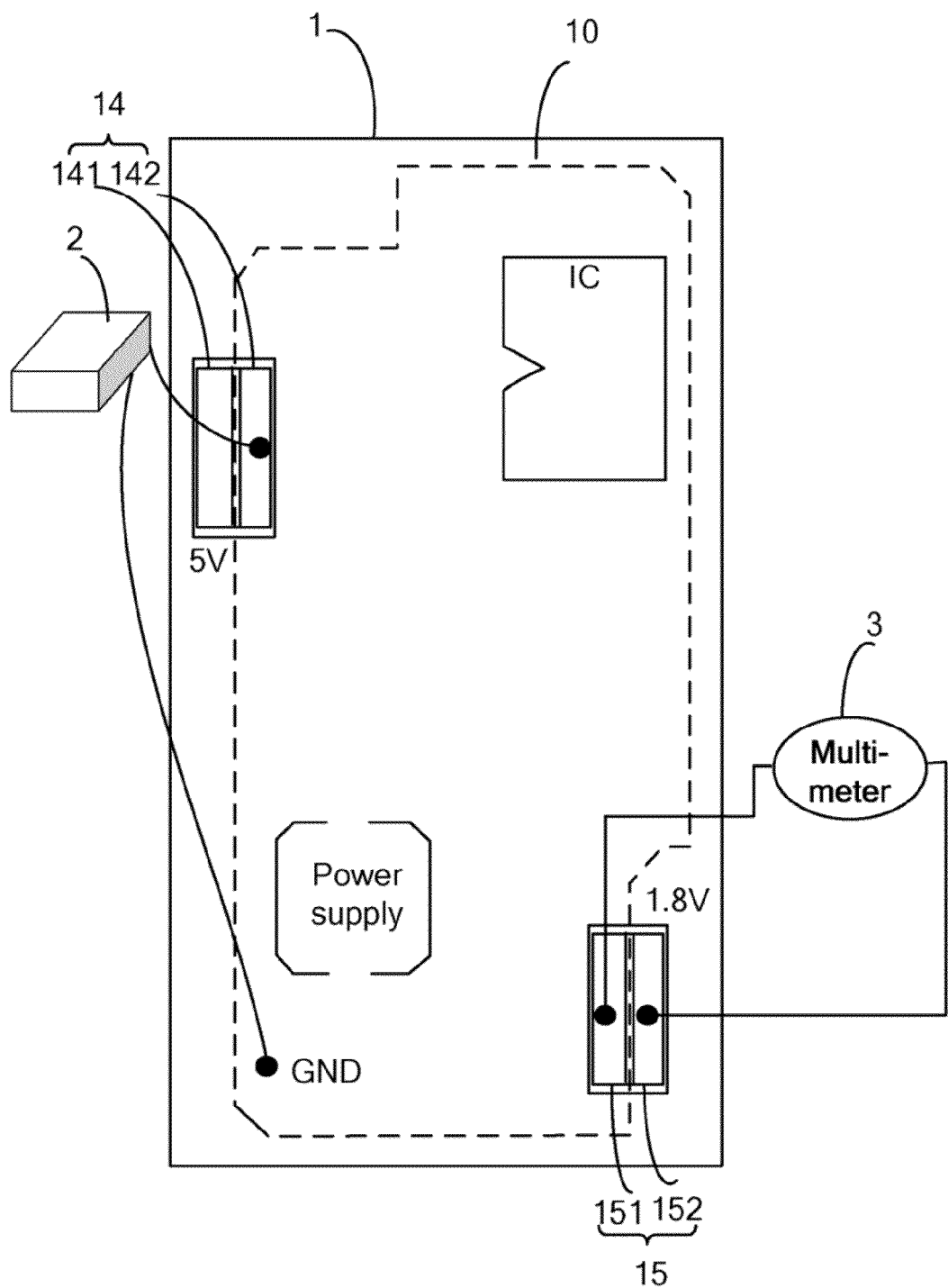
FIG. 2 is a schematic view showing how to test a voltage parameter and a current parameter of the power conversion circuit of the circuit board of FIG. 1.

Referring to FIGS. 1-2, an embodiment of a circuit board 1 including a number of power conversion circuits 10 is illustrated. Each power conversion circuit 10 converts a voltage from one voltage level to another to power an integrated circuit (IC) of an electronic device (not shown) having the circuit board 1. In initial, the connection between the number of power conversion circuits 10 and the connection between a power supply and the power conversion circuit 10 are both cut off.

Each power conversion circuit 10 includes an input port 11, an output port 12, a main body circuit 13, a first solder bridge 14, and a second solder bridge 15. The input port 11 of one power conversion circuit 10 is an output port 12 of the power conversion circuit 10 previous in sequence to the power conversion circuit. The output port 12 of one power conversion circuit 10 is an input port 11 of one power conversion circuit 10 next in sequence to the power conversion circuit. The main body circuit 13 includes at least one IC. The first solder bridge 14 is arranged between the input port 11 and the main body circuit 13. The second solder bridge 15 is arranged between the output port 12 and the main body circuit 13. During testing voltage and current of the power conversion circuit 10, the first solder bridge 14 and the second solder bridge 15 are open, and the connection between the input port 11 and the main body circuit 13 and the connection between the output port 12 and the main body circuit 13 are respectively cut off. When the first solder bridge 14 of one power conversion circuit 10 and the second solder bridge 15 of one power conversion circuit 10 are closed, the input port 11 of one power conversion circuit 10, the main body circuit 13 of one power conversion circuit 10, and the output port 12 of one power conversion circuit 10 are electrically connected to each other.

In this embodiment, a direct current (DC) power supply 2 is employed to supply a predetermined voltage to the input port 11, and a multimeter 3 is employed to detect the voltage and current of each power conversion circuit 10. The detected voltage and current are respectively compared with a predetermined voltage range and a predetermined current range to determine whether the power conversion circuits 10 works normally. In the embodiment, the DC power supply 2 can provide any voltage to the power conversion circuit 10, and the multimeter 3 can be replaced by other devices capable of detecting voltage and current of a circuit. To simplify illustrate the disclosure, the following description takes the power conversion circuit 10 which converts the voltage supplied by the DC power supply 2 from 5V to 1.8V as an example.

The first solder bridge 14 includes a first terminal 141 and a second terminal 142 spaced from the first terminal 141 with a predetermined distance. The second solder bridge 15 includes a third terminal 151 and a fourth terminal 152 spaced from the third terminal 151 with a predetermined distance. The terminals 141, 142, 151, 152 are fixed to the circuit board 1. The first terminal 141 is electrically connected to the input port 11, the second terminal 142 is electrically connected to the main body circuit 13, the third terminal 151 is electrically connected to the output port 12, and the fourth terminal 152 is electrically connected to the main body circuit 13.

In the initial state, the first terminal 141 and the second terminal 142 are disconnected from each other, and the third terminal 151 and the fourth terminal 152 are disconnected from each other. To test the voltage and the current of the power conversion circuit 10, the positive output terminal of the DC power supply 2 is connected to the second terminal 142. In addition, the negative output terminal of the DC power supply 2 is grounded to provide a predetermined voltage to the power conversion circuit 10, for example providing the voltage, which has a value of 5V to the power conversion circuit. The positive terminal of the multimeter 3 is connected to the third terminal 151 and the negative terminal of the multimeter 3 is connected to the fourth terminal 152 to test the voltage and the current of the power conversion circuit 10.

If the tested voltage and current are respectively within their predetermined ranges, such as the tested voltage is within the voltage range of 1.75-1.85, and the test current is within the current range of 1.95 A-2.05 A, the power conversion circuit 10 is determined to be in a normal state. If the tested voltage and current are out of their predetermined ranges, the power conversion circuit 10 is determined to be in an abnormal state. If the power conversion circuit 10 is determined to be in the normal state, when the circuit board 1 needs to work, the first terminal 141 and the second terminal 142 are connected to each other, and the third terminal 151 and the fourth terminal 152 are connected to each other, thus the power conversion circuit 10 supplies the converted voltage, such as 1.8V, to the next power conversion circuit 10 and the IC. In the embodiment, the first terminal 141 and the second terminal 142 are connected to each other by solder, and the third terminal 151 and the fourth terminal 152 are also connected to each other by solder. In another embodiment, a conductive wire connects the first terminal 141 and the second terminal 142, and a conductive wire connects the third terminal 151 and the fourth terminal 152.

With this configuration, to test the voltage and current of the power conversion circuit 10, the copper foil of the circuit 10 does not need to be cut off by an operator, thus the test of the power conversion circuit will be convenient.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A power conversion circuit to convert a voltage from one voltage level to another, comprising:
   an input port;
   an output port, the input port of the power conversion circuit being an output port of one power conversion circuit previous in sequence to the power conversion circuit, the output port of the power conversion circuit being an input port of one power conversion circuit next in sequence to the power conversion circuit;
   a main body circuit;
   a first solder bridge arranged between the input port of the power conversion circuit and the main body circuit of the power conversion circuit; and
   a second solder bridge arranged between the output port of the power conversion circuit and the main body circuit of the power conversion circuit.

2. The power conversion circuit as described in claim 1, wherein the first solder bridge comprises a first terminal and the second terminal spaced from the first terminal, the second solder bridge comprises a third terminal and a fourth terminal spaced from the third terminal, the first terminal is electrically connected to the input port, the second terminal is electrically connected to the main body circuit, the third terminal is electrically connected to the output port, and the fourth terminal is electrically connected to the main body circuit.

3. The power conversion circuit as described in claim 1, wherein when the first solder bridge and the second solder bridge are open, the connection between the input port and the main body circuit and the connection between the output port and the main body circuit are cut off.

4. The power conversion circuit as described in claim 1, wherein when the first solder bridge and the second solder bridge are closed, the input port, the main body circuit, and the output port are electrically connected to each other.

5. The power conversion circuit as described in claim 1, wherein when the first solder bridge and the second solder bridge are open, the input port is connected to a DC power supply to receive a predetermined voltage, and the voltage and the current of the power conversion circuit is tested by a multimeter.

6. The power conversion circuit as described in claim 2, wherein when the first terminal and the second terminal are disconnected from each other, and third terminal and the fourth terminal are disconnected from each other, the second terminal is connected to a positive output terminal of a DC power supply to receive a predetermined voltage provided by the DC power supply, the third terminal is connected to the positive terminal of a multimeter and the fourth terminal is connected to the negative terminal of the multimeter, thus the voltage and the current of the power conversion circuit is tested by the multimeter.

7. A circuit board comprising:
   a plurality of power conversion circuit, each of the power conversion circuit being to convert a voltage from one voltage to another, each of the power conversion circuit comprising:
   an input port;
   an output port, the input port of the power conversion circuit being an output port of one power conversion circuit previous in sequence to the power conversion circuit, the output port of the power conversion circuit being an input port of one power conversion circuit next in sequence to the power conversion circuit;
   a main body circuit;
   a first solder bridge arranged between the input port of the power conversion circuit and the main body circuit of the power conversion circuit; and
   a second solder bridge arranged between the output port of the power conversion circuit and the main body circuit of the power conversion circuit.

8. The circuit board as described in claim 7, wherein the first solder bridge comprises a first terminal and the second terminal spaced from the first terminal, the second solder bridge comprises a third terminal and a fourth terminal spaced from the third terminal, the first terminal is electrically connected to the input port, the second terminal is electrically connected to the main body circuit, the third terminal is electrically connected to the output port, and the fourth terminal is electrically connected to the main body circuit.

9. The circuit board as described in claim 7, wherein when the first solder bridge and the second solder bridge are open, the connection between the input port and the main body circuit and the connection between the output port and the main body circuit are cut off.

10. The circuit board as described in claim 7, wherein when the first solder bridge and the second solder bridge are closed, the input port, the main body circuit, and the output port are electrically connected to each other.

11. The circuit board as described in claim 7, wherein the first solder bridge and the second solder bridge are fixed to the circuit board.

12. The circuit board as described in claim 7, wherein when the first solder bridge and the second solder bridge are open, the input port is connected to a DC power supply to receive a predetermined voltage provided by the DC power supply, and the voltage and the current of the power conversion circuit are tested by a multimeter.

13. The circuit board as described in claim 8, wherein when the first terminal and the second terminal are disconnected from each other, and the third terminal and the fourth terminal are disconnected from each other, the second terminal is connected to the positive output terminal of a DC power supply to receive a predetermined voltage from the DC power supply, the third terminal is connected to the positive terminal of a multimeter and the fourth terminal is connected to the negative terminal of the multimeter, thus the voltage and the current of the power conversion circuit is tested by the multimeter.

* * * * *